(12) United States Patent
Gherman

(10) Patent No.: US 12,712,570 B2
(45) Date of Patent: Aug. 18, 2026

(54) METHOD AND DEVICE FOR CORRECTING ERRORS IN RESISTIVE MEMORIES

(71) Applicant: COMMISSARIAT A L'ENERGIE ATOMIQUE ET AUX ENERGIES ALTERNATIVES, Paris (FR)

(72) Inventor: Valentin Gherman, Grenoble (FR)

(73) Assignee: COMMISSARIAT A L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 30 days.

(21) Appl. No.: 18/917,923

(22) Filed: Oct. 16, 2024

(65) Prior Publication Data

US 2025/0131971 A1 Apr. 24, 2025

(30) Foreign Application Priority Data

Oct. 19, 2023 (FR) ...................................... 2311320

(51) Int. Cl.
*H03M 13/45* (2006.01)
*G06F 11/08* (2006.01)
(Continued)

(52) U.S. Cl.
CPC ........... *H03M 13/453* (2013.01); *G06F 11/08* (2013.01); *G06F 11/1012* (2013.01);
(Continued)

(58) Field of Classification Search
CPC ............. H03M 13/453; H03M 13/152; H03M 13/1565; G06F 11/08; G06F 11/1012; G06F 11/1048; G11C 29/42
See application file for complete search history.

(56) References Cited

U.S. PATENT DOCUMENTS 9,934,082 B2 * 4/2018 Tomishima ........ G11C 13/0004
11,184,024 B2 * 11/2021 Xiong ................. G06F 11/1012
(Continued)

OTHER PUBLICATIONS

K. X. Pinto, K. Kodali, A. Das and N. A. Touba, "Double Adjacent Error Correction in RRAM Matrix Multiplication using Weighted Checksums," 2024 IEEE 30th International Symposium on On-Line Testing and Robust System Design (IOLTS), Rennes, France, 2024, pp. 1-5 (Year: 2024).*
(Continued)

*Primary Examiner* — Cynthia Britt
(74) *Attorney, Agent, or Firm* — Baker Hostetler

(57) ABSTRACT

A device and a method for reading a code word in a resistive memory protected by an ECC where each memory cell includes resistive devices for storing a bit of a code word. The method allows the selection, as a function of the value of a syndrome, of a corrected word following a first decoding process without inversion of weak-bits or of a corrected word following a second decoding process with inversion of weak-bits. If the computed syndrome determines that the first decoding process has indicated an uncorrectable error or determines that the second decoding process has indicated neither an uncorrectable error nor an n-error (i.e., a maximum of n erroneous bits per code word), the selected word is the corrected word with inversion of the weak-bits. Otherwise, the selected word is the corrected word without inversion of the weak-bits.

15 Claims, 9 Drawing Sheets

(51) Int. Cl.
*G06F 11/10* (2006.01)
*G11C 29/42* (2006.01)
*H03M 13/15* (2006.01)

(52) U.S. Cl.
CPC .......... *G06F 11/1048* (2013.01); *G11C 29/42* (2013.01); *H03M 13/152* (2013.01); *H03M 13/1565* (2013.01)

(56) References Cited

U.S. PATENT DOCUMENTS 11,689,217 B2 * 6/2023 Kaynak ............. H03M 13/2948 714/758
11,705,925 B2 * 7/2023 Kaynak .............. H03M 13/1108 714/764
11,755,411 B2 * 9/2023 Roy ....................... G11C 29/10 714/764
11,775,383 B2 * 10/2023 Fackenthal ......... G06F 11/1076 714/764
11,799,496 B2 * 10/2023 Kwak ................. G06F 11/1048
2016/0179616 A1 6/2016 Ha et al.

OTHER PUBLICATIONS

A. Das and N. A. Touba, "Selective Checksum based On-line Error Correction for RRAM based Matrix Operations," 2020 IEEE 38th VLSI Test Symposium (VTS), San Diego, CA, USA, 2020, pp. 1-6 (Year: 2020).*
Cherman, et al., "Error correction improvement based on weak-bit-flipping for resistive memories", Microelectronics Reliability, vol. 136, p. 114669, 2022.
Lee, et al., "Efficient Chase-2 decoding algorithm for linear block codes", Electronics Letters, vol. 55, Issue 17, pp. 936-938, Aug. 22, 2019.
Freudenberger, et al., "A Low-Complexity Three-Error-Correcting BCH Decoder with Applications in Concatenated Codes", SCC 2019; 12th International ITG Conference on Systems, Communications and Coding, 2019 DOI: 10.30420/454862002.

* cited by examiner

400

500

600

METHOD AND DEVICE FOR CORRECTING ERRORS IN RESISTIVE MEMORIES

CROSS-REFERENCE TO RELATED APPLICATION

This application claims priority to foreign French patent application No. FR 2311320, filed on Oct. 19, 2023, the disclosure of which is incorporated by reference in its entirety.

FIELD OF THE INVENTION

The invention relates to the field of resistive memories or RRAMs (Resistive Random Access Memory), and more specifically relates to a method and a device for improving error correction in resistive memories, notably 1T1R and 2T2R type memories.

BACKGROUND

Resistive RRAM memories are non-volatile memories with a high operating velocity, low electric power consumption and a long lifetime. For these reasons, resistive memories are promising candidates for replacing both current random access memories and non-volatile memories such as flash memories.

Several resistive memory technologies exist. These notably include Conductive-Bridging Random-Access Memory (CBRAM), Oxide-based Random-Access Memory (OxRAM) or even Phase-Change Memory (PCM) resistive memories.

A resistive memory is made up of numerous resistive memory cells arranged in rows and columns in order to form a matrix. An RRAM memory cell is provided with at least one resistive element whose conductance can be modified.

Typically, an RRAM memory cell in its initial state has a metal insulating structure and is in a high resistance state (HRS). Some types of resistive memory, such as OxRAM or CBRAM memories, require electrical activation before they can be used. Applying an external high-voltage pulse across the RRAM cell allows conductive paths to be formed in the switching layer and the RRAM cell is switched to a low resistance state (LRS). The general process of this break in the insulating structure of the cell is generally referred to as "electroforming" or "forming".

The dielectric material that is disposed between the two conductive electrodes of the cell will allow the cell to reversibly switch between two HRS and LRS resistance states, with each state allowing an information bit to be stored in the memory cell.

In order to program a memory cell, a programming voltage is applied between the electrodes of the memory cell. This can be a programming voltage in the LRS state, or a programming voltage in the HRS state. However, after a programming operation, the memory cell may not transition to the desired resistance state. For this reason, an operation is usually carried out to check that the memory cell is correctly programmed by comparing its resistance value R with a predefined resistance threshold value $R_{REF}$.

FIG. 1*a* is a simplified illustration of an elementary resistive memory cell, generally made up of a transistor (T) and a resistive component (R) or resistor (102), where an information bit is encoded by the value of the electrical resistance of the resistor. For these elementary cells, a logic '0' can be encoded, for example, by programming the resistor in an LRS state, and a logic '1' then can be encoded by programming the resistor in an HRS state, and this is referred to as 1T1R mode encoding.

However, the difference between the lowest value corresponding to an HRS level and the highest value corresponding to the LRS level, also called "memory window", is often small. Hence, "differential encoding" or 2T2R encoding is commonly used to encode a binary value. An information bit then can be encoded in a "2T2R" memory cell, as illustrated in simplified form in FIG. 1*b*, and can be made up of two elementary 1T1R cells, and can comprise 2 transistors (2T) or (T1, T2) and 2 resistors (2R) or (112-1, 112-2).

As each of the HRS and LRS states can be associated with a logic value, i.e., 1 or 0, it is possible to consider that in a 2T2R cell one of the two resistive elements encodes the bit to be programmed in a non-inverted version, while the other resistive element encodes the same bit in an inverted version. For example, a logic '1' is encoded by programming the resistor of the first 1T1R cell in an HRS state and the resistor of the second 1T1R cell in an LRS state, and a logic '0' is encoded by programming the resistor of the first 1T1R cell in an LRS state and the resistor of the second cell in an HRS state.

During a write operation to a 1T1R memory cell or a 2T2R memory cell, it is important to ensure that each electrical resistor to be programmed in the HRS state or the LRS state is respectively either greater than or smaller than a reference value $R_{REF}$. The comparison of an electrical resistance with the value $R_{REF}$ is carried out by a read operation, during which each programmed resistance is compared with the value $R_{REF}$ using a sense amplifier (SA) illustrated by the component 104 in FIGS. 1*a* and 114 in FIG. 1*b*. Hereafter, this read operation with comparison with a reference value is referred to as reading in 1T1R mode or 1T1R reading.

In FIG. 1*a*, the sense amplifier 104 responds to the difference between its input 'SL' (originating from the 1T1R cell) and its input '$R_{REF}$' (representing a reference electrical resistance value $R_{REF}$), in order to generate an output signal '$V_{OUT}$' that indicates the resistive state of the memory element of the cell and provides information concerning the value that is stored in the 1T1R cell.

In FIG. 1*b*, the sense amplifier 114 will respond to a difference on its inputs in order to generate an output signal '$V_{OUT}$'. In this implementation, a multiplexer (113-1, 113-2) is respectively coupled to the output (SL1, SL2) of each 1T1R cell in order to carry out 1T1R reading through a comparison with the reference value $R_{REF}$. During 2T2R reading, the output of each multiplexer corresponds to the value of each respective cell (SL1, SL2), and becomes an input of the sense amplifier 114. The output of the sense amplifier 114 then responds to the difference in resistance of the two resistive elements of the 2T2R cell (112-1, 112-2) and provides information concerning the value that is stored in the selected 2T2R cell.

Using a memory involves frequent transitions between an HRS state and an LRS state, and vice versa, and each switching event between these resistive states can introduce damage. In addition, the values of the programmed resistances can change due to relaxation phenomena, resulting in a loss of the information stored in the RRAM.

Furthermore, resistive memories also exhibit cell-to-cell non-uniformity, which also degrades the reliability of the memory. The source of this variability is attributed to manufacturing process non-uniformities, such as the thickness of the switching film, etching damage and the surface roughness of the electrodes.

These variations, coupled with relaxation phenomena, mean that the resistances of the resistive memories that are programmed in the LRS state can drift toward an HRS state, and the resistances that are programmed in the HRS state can drift toward an LRS state. Hence, this shifting of the programmed resistance values can lead to errors during read operations.

In order to reduce the error rate of the memories, a common solution involves using an error-correcting code (ECC) that encodes data before it is written to memory. When encoding data using an ECC code, check bits are added to the data bits, with the check bits representing redundant information computed from the data bits, allowing errors affecting both the data bits and the check bits to be detected and corrected. All the data bits and check bits together form a code word.

A particular type of error-correcting code is the binary and linear ECC. A "linear binary error-correcting code" is understood to mean a set of words that are generated by adding, to a plurality k of data bits, a defined number r of check bits that is computed based on the plurality k of data bits. The check bits are generated from the data bits in accordance with the following equation (1):

$$H \cdot v = 0, \quad (1)$$

where v is a column vector corresponding to a code word (k data bits and r check bits), and where H corresponds to a parity matrix that only comprises binary values ('0' or '1') and where each column of the matrix is different from the other columns, and comprises at least one value other than 0.

When programming data into a memory protected by an ECC, each memory word v is programmed to store a code word. When reading the data present in the memory, each memory word v is checked by evaluating the value of the matrix product H·v.

The result of this operation is a binary vector s called "syndrome". If the syndrome is a zero vector, i.e., each of its bits is equal to zero, the code word is considered to be correct. A non-zero syndrome indicates the presence of at least one error. This evaluation is formalized by the following formula:

$$H \cdot v = s$$

When the syndrome allows the positions of the erroneous bits to be identified, the code word can be corrected.

When a high error rate is present, one solution involves using increasingly powerful ECCs, i.e., allowing more and more erroneous bits in a code word to be corrected. However, this entails an increasingly large additional cost in terms of the storage area for the check bits and in terms of the latency and power consumption of the ECC decoder.

One approach for avoiding the use of a powerful ECC is to reduce the primary error rate, i.e., the error rate at the output of the memory circuit as would be obtained without the use of an ECC. One method for reducing the primary error rate involves using 2T2R memories instead of 1T1R memories. However, situations exist where even with the use of a 2T2R memory the primary error rate remains high.

Furthermore, in situations where (a) even with a 2T2R memory the primary error rate remains high, where (b) the cost of a 2T2R memory is considered to be too high, or where (c) an ECC with a lower additional cost (and therefore a lower correction capacity) must be selected, one solution involves identifying "weak-bits", which are bits that are likely to be erroneous from among the bits obtained during a read memory operation. This information is then used to improve error correction.

The article by V. Gherman, L. Ciampolini, S. Evain and S. Ricavy entitled, "Error Correction Improvement based on Weak-bit-Flipping for Resistive Memories", Microelectronics Reliability, volume 136, 2022, describes a method and devices for identifying weak-bits and increasing the correction capacity of an ECC based on identifying weak-bits. The principle involves initiating a procedure for identifying weak-bits only if the ECC decoder indicates an uncorrectable error during a read memory operation. In the case of 1T1R memories, this procedure involves comparing the resistance of each resistor in the read word, on the one hand, with a slightly higher reference value, and, on the other hand, with another slightly lower reference value than the reference value normally used during the read operation. In the case of 2T2R memories, this procedure involves comparing the resistances of each pair of resistors used to encode the value of each read bit with one another, by applying a slight resistive bias, firstly to one of the resistors and then to the other resistor. Any bit whose value changes during these evaluations is labelled as "weak" and referred to as being a "weak-bit". The ECC decoding of the initial word is then repeated with all the weak-bits inverted, which significantly increases the chances of correcting conventionally uncorrectable errors and ultimately reduces the error rate of the memory.

The expression "conventionally uncorrectable errors" must be understood to mean errors that cannot be corrected by the ECC decoder used for the read operations, i.e., conventionally used with the capacity of the ECC.

Similarly, the expression "conventionally correctable errors" must be understood to mean errors that can be corrected by the ECC decoder according to the capacity of the ECC.

This approach involves carrying out two "hard decision decoding" decoding processes as opposed to approaches that carry out a first hard decision decoding process and one or more other compound soft decision decoding processes.

Patent application US 2016/179616 A1 by Ha Jeong-Seok et al. describes a method for reading and correcting a code word stored in a flash memory that begins with hard decision decoding of a code word read from the flash memory. If the hard decision decoding fails, soft decision decoding is carried out that is made up of $2^p$ hard decision decoding processes. These mixed hard and soft decision decoding approaches have the disadvantage, among other disadvantages, of being more expensive because they require additional storage capacities in order to store the results of all the hard decision decoding processes.

The dual hard decision decoding approach proves effective for ECCs that allow (a) correction of a maximum of n erroneous bits per code word, which maximum is referred to as "n-error" throughout the remainder of the description, and (b) detection of all the errors that affect n+1 bits, which number is referred to as "(n+1)-error" throughout the remainder of the description.

However, for a given number of data bits per code word, detecting (n+1)-errors requires ECCs that have an additional check bit per code word, compared with ECCs that simply allow the correction of n-errors. In addition, this extra cost can be amplified in the case where code words are required with a total number of bits that is a multiple of a certain constant D, for example, a multiple of D=4. In this case, it is possible that adding an additional check bit per word also involves adding D cells per word instead of adding a single cell. This then results in an additional cost multiplied by D.

Furthermore, faced with the problem of error correction in resistive memories, there is still a need for a solution that overcomes the various disadvantages of the known solutions.

SUMMARY OF THE INVENTION

The present invention addresses this need.

The aim of the invention is a solution for improving error correction in resistive memories protected by an error-correcting code (ECC).

In general, the principle of the invention is based on a method for selecting, as a function of the value of a syndrome, a word corrected after a first decoding process without inversion of weak-bits, or a word corrected after a second decoding process with inversion of weak-bits. If the computed syndrome determines that the first decoding process has indicated an uncorrectable error, or determines that the second decoding process has indicated neither an uncorrectable error nor an n-error (i.e., a maximum of n erroneous bits per code word), the selected word is the corrected word with inversion of the weak-bits. Otherwise, the selected word is the corrected word without inversion of the weak-bits.

Advantageously, the method allows the gain in error correction capacity to be increased, and/or allows the additional cost in terms of check bits to be eliminated, by initiating operations for identifying and using weak-bits, not only following the detection of an uncorrectable error, but also when certain correctable errors are present.

Thus, for example, the identification of an n-error by an ECC decoder, where n is the maximum number of erroneous bits that can be corrected in a code word, is information that is used by the method of the invention to initiate operations for identifying and using weak-bits, irrespective of the properties of the ECC.

If the ECC allows all the n-errors to be corrected, but does not allow all the (n+1)-errors to be detected (which is also expressed by the fact that the minimum Hamming distance between code words is equal to 2n+1), then an (n+1)-error can produce a syndrome that will be identical to that generated by an n-error. The conventional decoders of such an ECC cannot correct an (n+1)-error that generates the same syndrome as an n-error. Advantageously, by applying the method of the present invention, such (n+1)-errors can be corrected even with a conventional decoder, by identifying and inverting any weak-bits. However, the inventors have found that this approach poses a risk of compromising the correction of n-errors. Furthermore, in order to minimize this risk, in the case of a word whose ECC decoding generates a syndrome that can correspond to an n-error, the inventors have improved the method of the invention in an alternative embodiment that proposes decoding a memory word with and without inversion of weak-bits, and then selecting the corrected word with inversion of weak-bits only if the resulting syndrome corresponds to an error that affects fewer than n erroneous bits.

In cases where the ECC allows correction of all the n-errors and also the detection of all the (n+1)-errors (which is also expressed by the fact that the minimum Hamming distance between the code words is equal to 2n+2), a conventional decoder combined with weak-bits can correct almost all the (n+1)-errors.

Advantageously, the inventors have developed an approach that allows (n+2)-errors to be corrected. Faced with the problem that the syndromes of (n+2)-errors can be identical to those generated by n-errors, and that conventional correction of (n+2)-errors is not then possible, the method of the present invention allows such an (n+2)-error to be corrected even with a conventional decoder, by identifying and then inverting any weak-bits. The risk of compromising the correction of n-errors is addressed as before by selecting the corrected word with inversion of weak-bits only if the resulting syndrome corresponds to an error that affects fewer than n erroneous bits.

In order to achieve the desired aim, a device is proposed for reading a code word stored in a resistive memory where each memory cell comprises resistive devices for storing a bit of a code word according to the independent device claim.

Alternative or combined embodiments are proposed in the dependent claims.

A further aim of the invention covers any FPGA or ASIC type electronic system comprising a device according to the invention.

The invention also covers a method for reading a code word stored in a resistive memory where each memory cell comprises resistive devices for storing a bit of a code word according to the independent method claim.

Alternative embodiments are proposed in the dependent claims.

Advantageously, the method of the present invention can be implemented on conventional, simple and fast decoders, and does not affect the write operations to the relevant resistive memories.

Figure 1A:
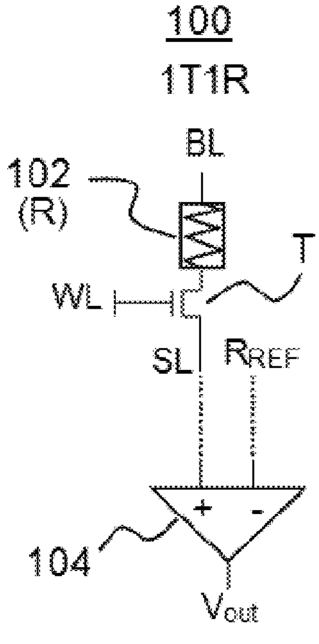
FIG. 1*a* and FIG. 1*b*, already described, illustrate examples of the implementation of a 1T1R memory cell and of a 2T2R memory cell, respectively.
Figure 1B:
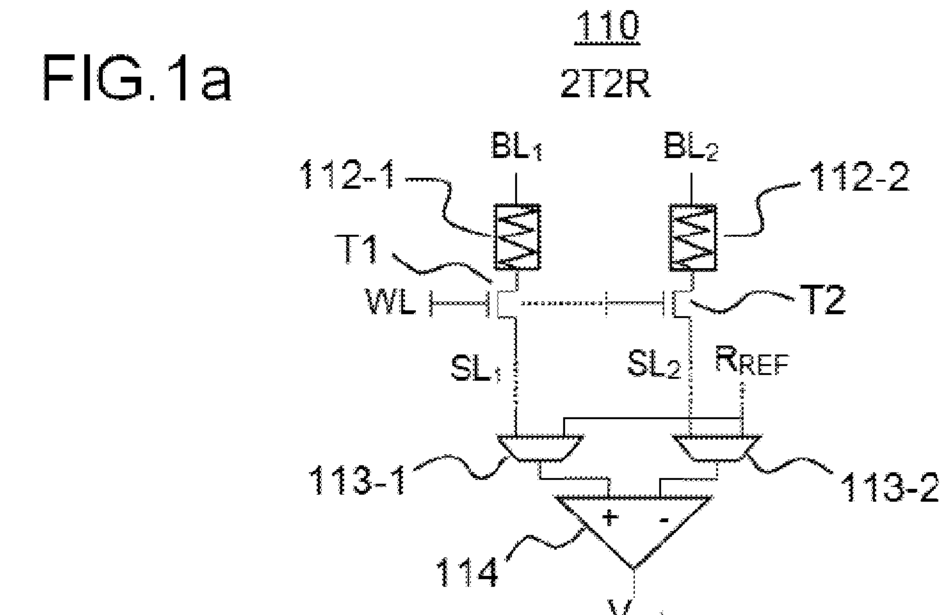
Figure 2:
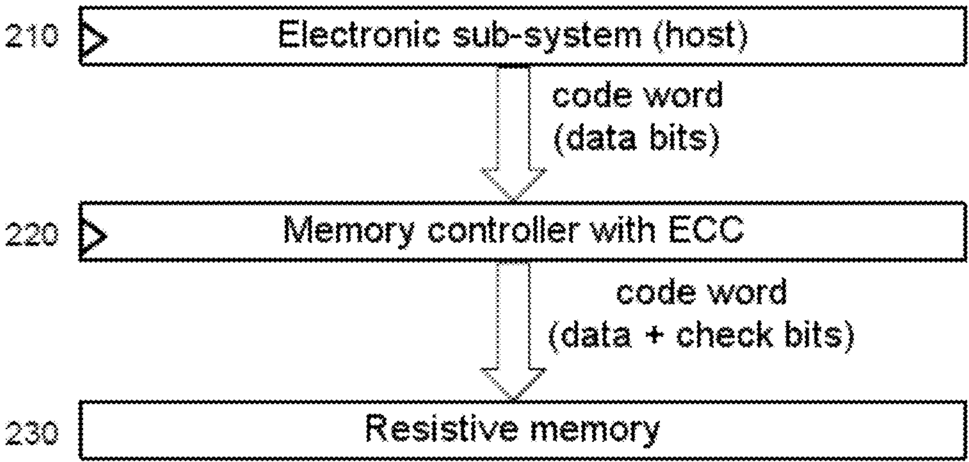
Figure 3:
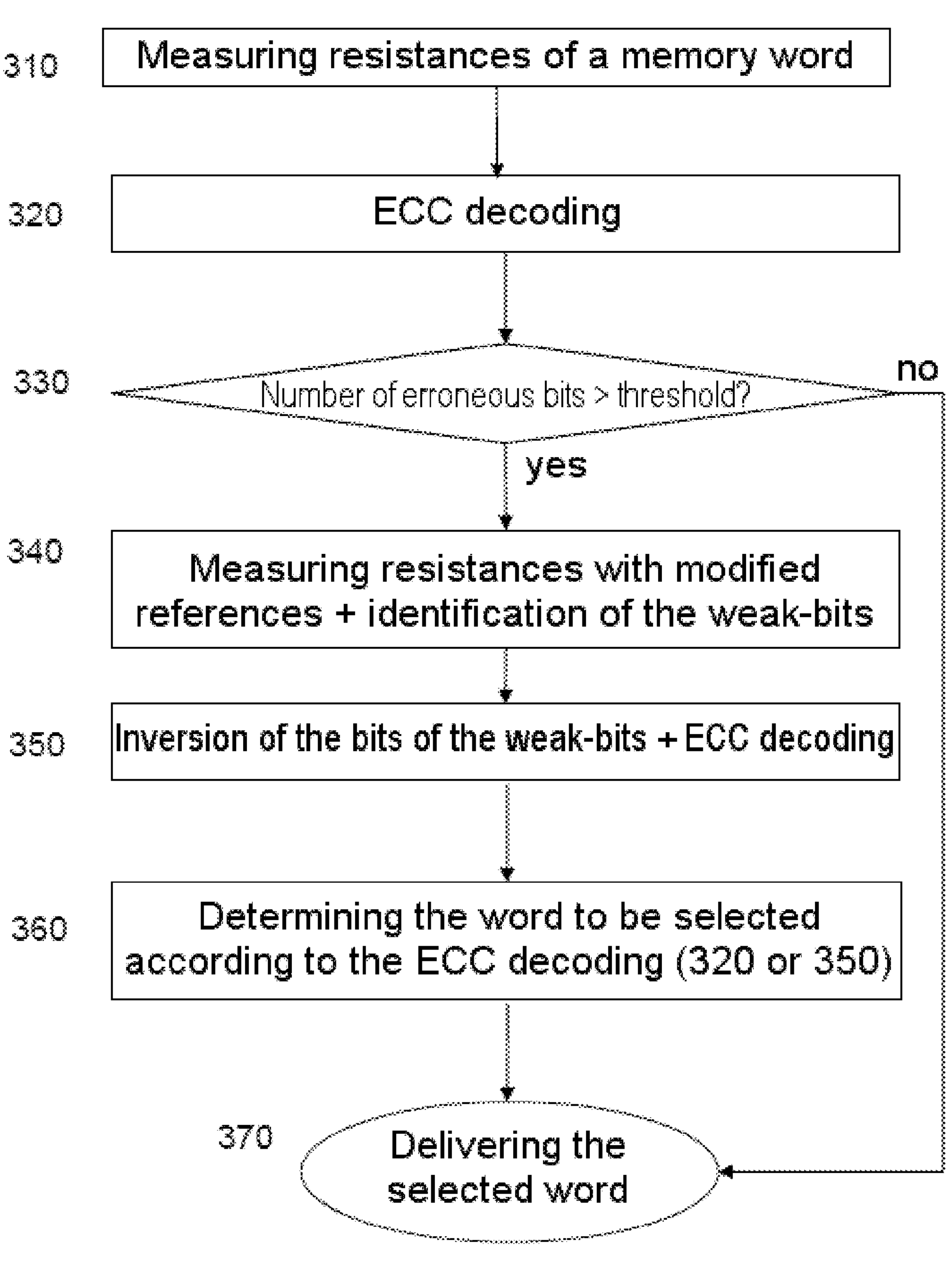
Figure 4:
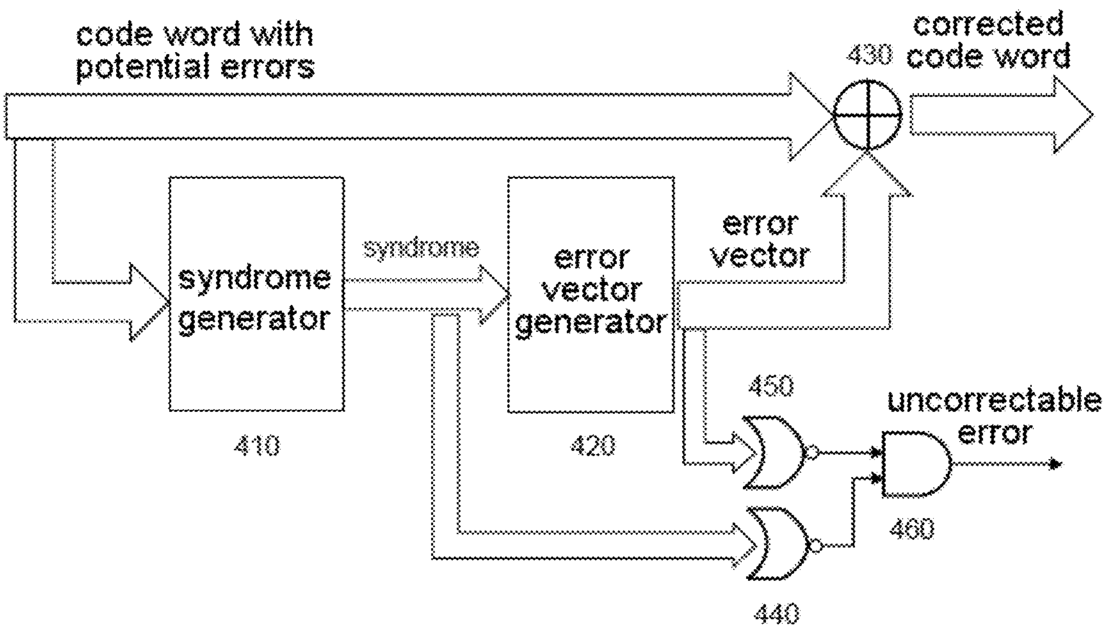
Figure 5:
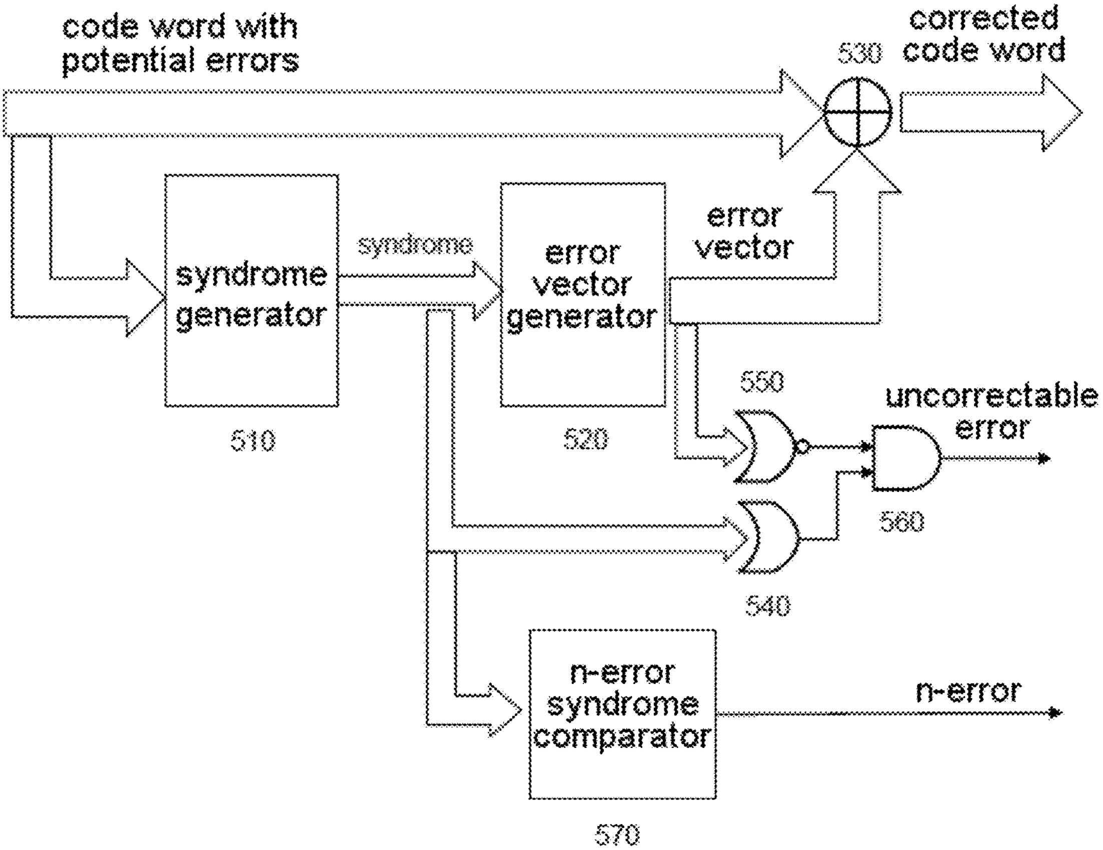
Figure 6:
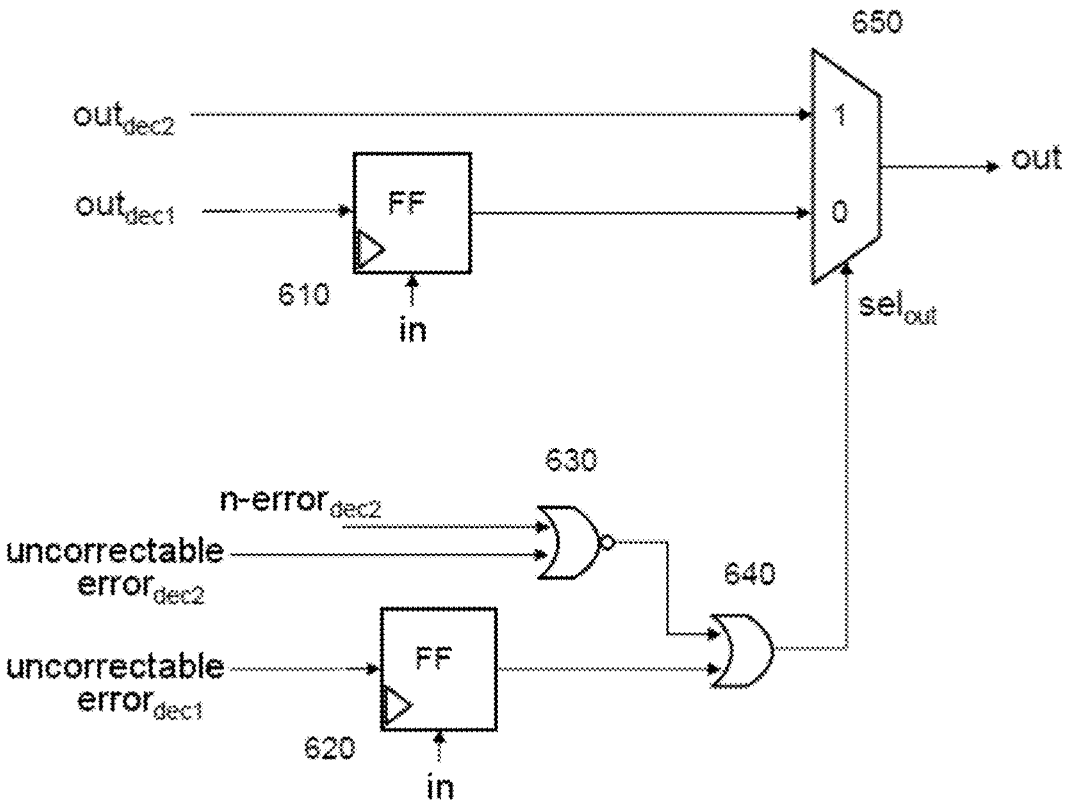
Figure 7:
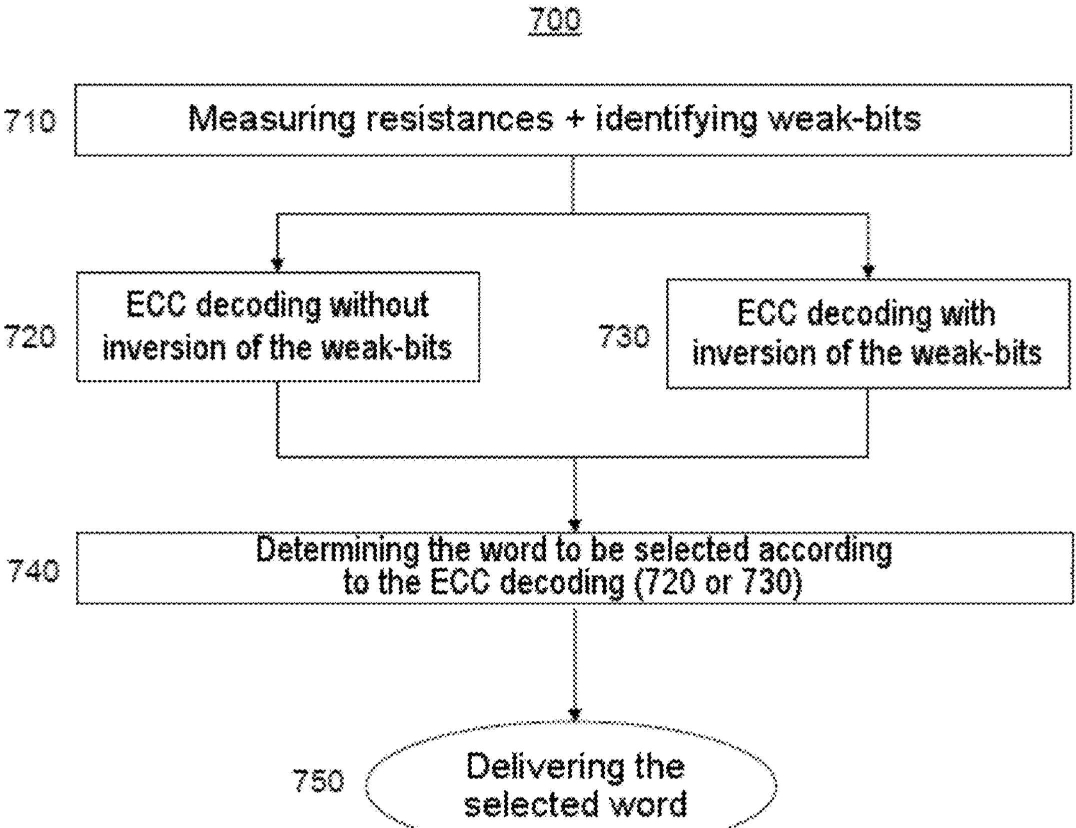
Figure 8:
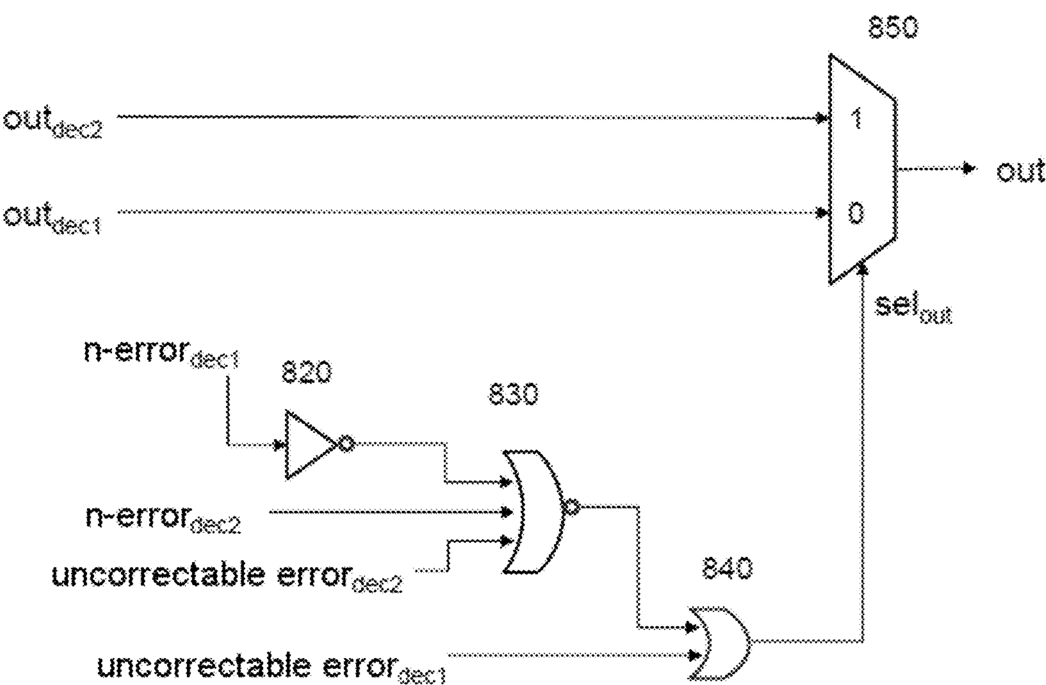
Figure 9:
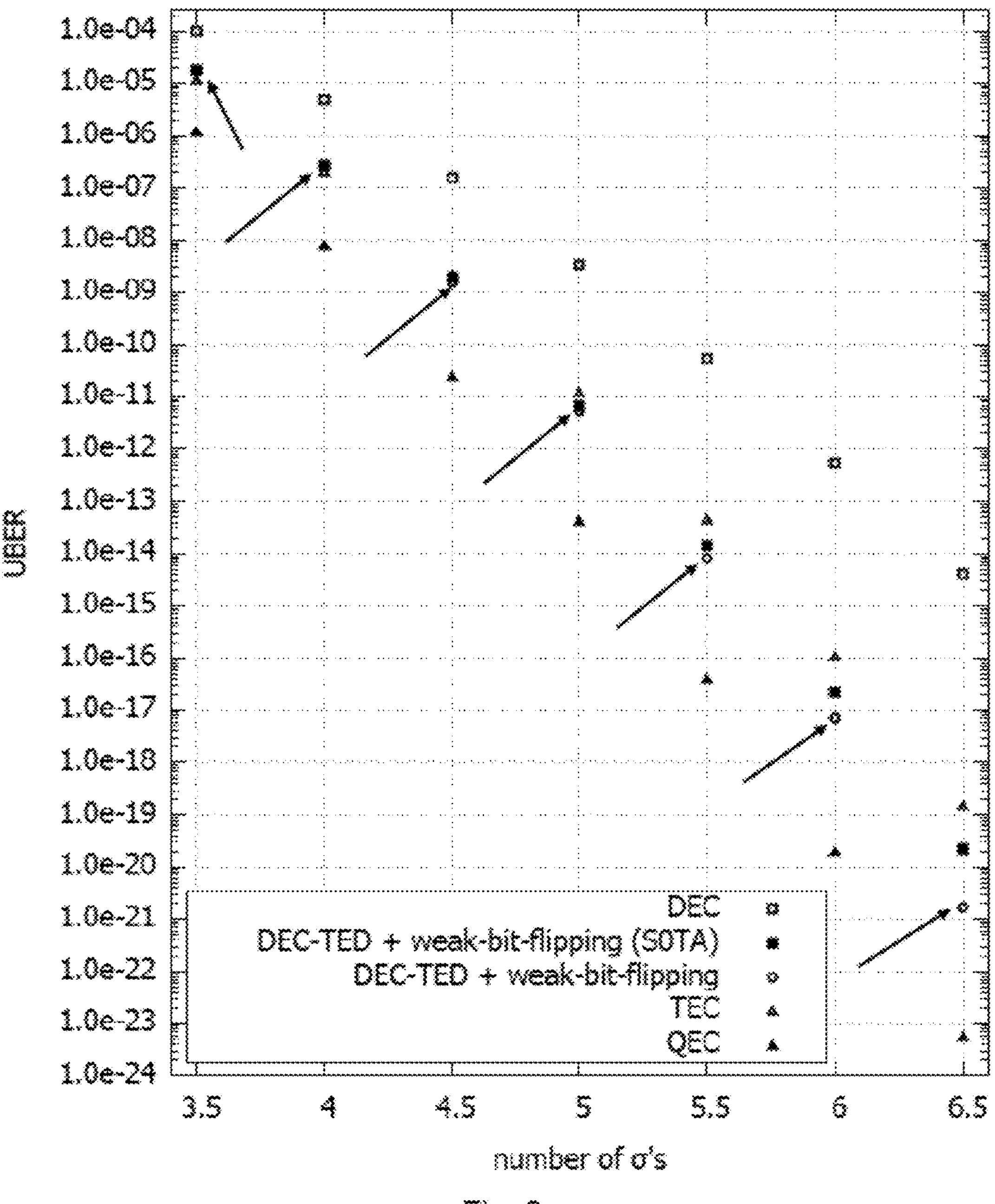

Further features, details and advantages of the invention will become apparent upon reading the description, which is provided with reference to the appended drawings, which are provided by way of an example and which show, respectively:

FIG. 2 shows an example of a system for write and read operations for data words in a resistive memory;

FIG. 3 illustrates the steps of the error correction method of the invention according to one embodiment;

FIG. 4 illustrates an architecture of an ECC decoder that can be used in a memory controller for implementing the method of the invention;

FIG. 5 illustrates a variant of the architecture of an ECC decoder that can be used in a memory controller for implementing the method of the invention;

FIG. 6 illustrates an embodiment of a circuit for selecting a corrected word;

FIG. 7 illustrates the steps of the error correction method of the invention according to another embodiment;

FIG. 8 illustrates an embodiment of a circuit for selecting a corrected word adapted to the method of FIG. 7;

FIG. 9 shows a graph comparing the error correction rates according to the prior art and the method of the present invention.

DETAILED DESCRIPTION

FIG. 2 schematically shows an example of a system for write and read operations for data words in a resistive memory. The general architecture of the system 200 integrates a host electronic system 210, a memory controller 220 and an RRAM resistive memory 230.

The host 210 can be made up of one or more processor cores, a microcontroller, a field programmable gate array (FPGA) or an application-specific integrated circuit (ASIC).

The memory controller 220 controls the write and read operations in the resistive memory 230. It generally comprises an encoder and an error-correcting code (ECC) decoder.

FIG. 2 also shows the data flow during a write operation to the memory 230. Before being stored in the memory 230, the bits of a data word sent by the host system 210 are used by the ECC encoder of the memory controller 220 to generate check bits, and to deliver a code word comprising the data bits and the check bits. These check bits are stored at the same address in the resistive memory 230 as the data bits. They can be used by the ECC decoder of the memory controller to correct any storage errors.

FIG. 3 illustrates the steps of the error correction reading method of the invention according to one embodiment. The method 300 is applicable when reading from a memory protected by an ECC, and allows error correction to be improved by operations for identifying weak-bits, the optional inversion of weak-bits, and by selecting a corrected code word with or without inversion of weak-bits.

The read method 300 begins with a step 310 of measuring the resistances of the resistive devices present in each memory cell of a read address. In 1T1R memories, this measurement can involve comparing the measured resistance with a reference resistance. In 2T2R memories, this measurement can involve a comparison between the resistances of the two resistive devices present in each memory cell.

Following this measurement, a logic value is associated with each memory cell. The resulting word is then decoded 320 according to the type of ECC that was used to encode the data before it was programmed at the read address.

The next step 330 involves determining whether the decoding detects a number of erroneous bits that may or may not be greater than a predefined threshold. In one embodiment, the threshold is 'n−1' bits for an ECC that can correct a maximum of 'n' bits.

If the number of erroneous bits does not exceed the threshold, the word obtained following the first ECC decoding is delivered in a subsequent step 370 in order to be transmitted to the host 110.

If, in step 330, the number of erroneous bits is determined to be greater than the threshold, advantageously, the method of the invention uses additional information that can be obtained during the decoding step to improve the error correction capacity.

Indeed, during the ECC decoding phase, the presence of errors that are detectable but are conventionally uncorrectable can be determined. This detection amounts, for example, to identifying a subset of (n+1)-errors for an ECC with a minimum Hamming distance equal to 2n+1, or even to identifying all the (n+1)-errors and a subset of (n+2)-errors for an ECC with a minimum Hamming distance that is equal to 2n+2.

Furthermore, the decoding step also allows the presence of conventionally correctable errors to be identified that affect a maximum number of erroneous bits. This detection is equivalent, for example, to identifying n-errors for an ECC with a minimum Hamming distance that is equal to 2n+1 or 2n+2.

Such detection can be implemented using conventional techniques. One possible embodiment involves, for example, knowing the syndromes (i.e., each vector resulting from the matrix product H·v) generated by all the n-errors, comparing all these syndromes with the syndrome generated during the ECC decoding operation, and identifying whether the memory word that has just been read contains a number of erroneous bits that exceeds the threshold of n−1.

An alternative embodiment involves checking whether the memory word that has just been read generates a non-zero syndrome, thereby indicating the presence of erroneous bits, and which is different from all the syndromes generated by errors affecting fewer than n bits.

For BCH-type ECCs (Bose, Ray-Chaudhuri and Hocquenghem), an effective detection variant involves evaluating the determinants of matrices associated with error location polynomials (according to the BCH codes theory), as described in the article by J. Freudenberger, M. Rajab and S. Shavgulidze entitled "A Low-Complexity Three-Error-Correcting BCH Decoder with Applications in Concatenated Codes", published in the "International ITG Conference on Systems, Communications and Coding" in 2019, DOI: 10.30420/454862002.

Advantageously, the method of the invention considers the number of detectable but conventionally uncorrectable errors and/or the number of conventionally correctable errors that affect a maximum number of erroneous bits (n-error), in order to determine whether the threshold of the maximum number of bits correctable by the ECC is exceeded.

If this is confirmed, in a subsequent step 340, the method allows new resistance measurements to be carried out for the resistive devices present in each memory cell at the read address in order to identify weak-bits.

The general principle is that any read bit whose value changes during new evaluations is labelled as being a "weak-bit".

The method continues with a step 350 involving inverting all the identified weak-bits, and then carrying out a second ECC process for decoding the initial word with all the inverted weak-bits.

Solutions for identifying and inverting weak-bits in 1T1R and 2T2R memories are described in the aforementioned paper by V. Gherman, L. Ciampolini, S. Evain and S. Ricavy entitled "Error Correction Improvement based on Weak-Bit-Flipping for Resistive Memories", Microelectronics Reliability, volume 136, 2022.

As with the first decoding process 320, the second decoding process in step 350 indicates the presence of an n-error and/or of a detectable but uncorrectable error.

With further reference to FIG. 3, the next step 360 involves determining and selecting the version of the corrected code word that has the fewest erroneous bits, between the initial word after the first decoding process (step 320) and the word with inversion of weak-bits after the second decoding process (step 360).

The method allows the word decoded in the second decoding process after inversion of the weak-bits in step 350 to be selected if and only if:

- the first decoding process in step 320 has indicated an uncorrectable error; or
- the second decoding process in step 350 has indicated neither an n-error nor an uncorrectable error.

In cases where each of the two decoding processes indicates a detectable but uncorrectable error, the method allows a warning signal to be sent to the system.

The method ends with a step 370 involving delivering the code word selected in the previous step to the host.

Thus, by identifying conventionally correctable errors that affect a maximum number of erroneous bits (n-error) and/or identifying detectable conventionally uncorrectable errors, the method of the invention allows more errors to be corrected without increasing the number of check bits.

As already indicated, a block type binary and linear ECC is a set of fixed size binary code words, each code word v of which can be defined by means of a binary parity matrix H. The matrix H of a BCH type ECC is capable of correcting up to n bits per code word.

Such a matrix has a structure similar to that of a Vandermonde-type matrix that is depicted as follows:

$$H = \begin{bmatrix} \alpha^0 & \alpha^1 & \alpha^{1\cdot 2} & & \alpha^{1\cdot(l-1)} \\ \alpha^0 & \alpha^2 & \alpha^{2\cdot 2} & & \alpha^{2\cdot(l-1)} \\ \alpha^0 & \alpha^3 & \alpha^{3\cdot 2} & \dots & \alpha^{3\cdot(l-1)} \\ \vdots & \vdots & \vdots & & \vdots \\ \alpha^0 & \alpha^{2n} & \alpha^{2n\cdot 2} & & \alpha^{2n\cdot(l-1)} \end{bmatrix},$$

where l is the number of bits per code word and α is a vertical m-tuple representing the primitive element of a finite field $GF(2^m)$, with $2^{m-1}-1<l\leq 2^m-1$.

When decoding a code word v belonging to a BCH type ECC capable of correcting up to n erroneous bits per code word (with the decoding of a code word being used to find and correct the bits that are erroneous), the relationship provided by the equation (1) can be divided into several expressions, each corresponding to a row of the matrix H, and can be formulated as follows by the equation (2):

$$s_i = \sum_{j=0}^{l-1} \alpha^{i*j} v_j = \sum_{l=0}^{l-1} \alpha^{i*j} e_j, \tag{2}$$

where $v_j$ is a bit of the code word and $s_i$ is a syndrome component depicted as an element of the finite field $GF(2^m)$, with $1\leq i\leq 2n$.

Equation (2) is formulated using the bits $e_j$ of the error vector. By definition, a bit $e_j$ of an error vector is equal to 1 only if the corresponding bit in the code word $v_j$ is erroneous. Expression (2) reflects the fact that, in the absence of errors, all the bits of the syndrome s become equal to zero in accordance with equation (1), and all the components $s_i$ become equal to the zero element of the finite field $GF(^{2m})$.

It can be seen that a code word v then can be decoded using an "error location polynomial" according to equation (3):

$$\sigma(X) = 1 + \sigma_1 X + \dots + \sigma_{i-1} X^{i-1} + \sigma_i X^i = (1+\alpha^{j_1} X)(1+\alpha^{j_2} X)\dots(1+\alpha^{j_i} X) \tag{3}$$

where $j_1, \ldots, j_i$ represent the indices (or positions) of the erroneous bits in the code word.

Once the polynomial σ(X) has been established, the value of $\sigma(\alpha^{-j})$ can be evaluated for all the values j corresponding to indices of bits (data) in the code word v in order to locate all the erroneous bits (data). This search can be carried out at the same time. If required, the check bits of the code word v also can be generated by the ECC encoder from corrected data bits.

Expressions for the coefficients of the polynomial σ(X) can be found using Newton identities formalized by the following matrix equation:

$$\begin{bmatrix} 1 & 0 & 0 & & 0 \\ s_2 & s_1 & 1 & & 0 \\ s_4 & s_3 & s_2 & \dots & 0 \\ \vdots & \vdots & \vdots & & \vdots \\ s_{2i-4} & s_{2i-5} & s_{2i-6} & & s_{i-3} \\ s_{2i-2} & s_{2i-3} & s_{2i-4} & & s_{i-1} \end{bmatrix} \cdot \begin{pmatrix} \sigma_1 \\ \sigma_2 \\ \vdots \\ \sigma_i \end{pmatrix} = \begin{pmatrix} s_1 \\ s_3 \\ \vdots \\ s_{2i-1} \end{pmatrix}$$

The resultant expressions of $\sigma_j$ of this equation depend on the number of erroneous bits in a code word and can be established when designing an ECC decoder.

If $D_i$ denotes the determinant of the i×i matrix involved in the left-hand side of the previous equation, it can be shown that $D_i$ is either equal to zero if the number of erroneous bits in a code word is less than i−1, or non-zero if the number of erroneous bits in a code word is equal to i−1 or to i.

Following the same reasoning, similar matrices with their determinants can be defined for values of i ranging between 2 and n+1, with n being the maximum number of correctable erroneous bits per code word.

An ECC capable of correcting up to n bits per code word can be extended to allow additional detection of errors affecting n+1 bits per code word, by adding an additional check bit to impose a fixed total parity on all the code words. This increases the minimum Hamming distance between code words by one. Subsequently, without any loss of generality, such a total parity bit is considered to be selected in such a way that all the code words of an extended ECC are even.

The determinants $D_i$ thus can be used to determine the number of erroneous bits in a code word, optionally in combination with an evaluation of the property of a fixed total parity, if available.

According to the above, the number n of erroneous bits in a code word for a BCH type ECC can be detected by evaluating whether the determinant Dn+1 is either equal to zero if the number of erroneous bits is less than n, or is non-zero if the number of erroneous bits is equal to n or n+1. This also allows unconventional detection of errors affecting n+1 bits, which errors can generate syndromes identical to those generated by errors affecting n bits.

The presence of errors affecting n or n+1 bits in a code word for a BCH type ECC with a minimum Hamming distance between the code words that is equal to 2n+1 ($d_H$=2n+1) can be indicated by an alarm or warning signal computed by evaluating the determinants, according to the following equation (4):

$$\text{alarm}_{ECC} = \vee D_{n+1}, \tag{4}$$

where the expression on the right represents the "or logic" operator on all the bits of the determinant $D_{n+1}$ (which is an element of the finite field $GF(^{2m})$).

An improved embodiment of the invention aims to implement the method described with reference to FIG. 3 for an ECC with a minimum Hamming distance between the code words that is equal to 2n+2 ($d_H$=2n+2).

For an ECC with $d_H$=2n+2, the comparison threshold of step 330 of FIG. 3 remains equal to n−1, which still allows correction of errors affecting up to n bits or detection of errors affecting n+1 bits.

However, in the case of an ECC with a minimum Hamming distance between the code words that is equal to $d_H=2n+2$, the advantage involves being able to detect and correct errors affecting up to n+2 bits. However, the direct application of equation (4) for evaluating a determinant $D_{n+2}$ would require the presence of the syndrome components $s_{2n+1}$ and $s_{2n+2}$ computed according to equation (2). This would require additional check bits, and consequently would lead to an additional cost in terms of storage capacity.

The inventors also propose a different approach without an additional implementation cost, retaining the same detection method and implementing it on the same circuits, in order to detect and correct errors affecting up to n+2 bits.

The principle involves applying a variant of equation (4) to generate an '$alarm_{ECC}$' alarm signal indicating the presence of errors up to n+2 bits, by evaluating the value of the determinants $D_i$ of a parity matrix H established for the relevant ECC and according to the value of n.

A first example is applicable in the case where n is equal to 2 with a DEC-TED type BCH code. The aim then involves detecting errors affecting up to 4 bits (n+2) in a code word.

Equation (4) is then available as a variant (5) in order to determine the presence of such an error and generate an '$alarm_{DEC\text{-}TED}$' alarm signal.

The means for determining, in each version of the decoded code word, whether a number of errors is greater than 'n−1=1' are based on the evaluation of the following equation (5):

$$\text{alarm}_{DEC-TED} = \left(\overline{\sum v} \wedge \vee D_2\right) \vee \vee D_3 \tag{5}$$

where:

- $D_2$ and $D_3$ are determinants $D_i$ defined as described above for a DEC-TED type BCH type ECC;
- Σv represents the "exclusive-or" logical operator on all the bits of a received code word v, with the result yielding the total parity of the word v;
- a row above a logical expression indicates the "logical negation" operator;
- the symbol '∧' indicates the "and logic" operator;
- V $D_i$ indicates the "or logic" operator on all the bits of a determinant $D_i$ as defined above.

A second example is applicable in the case where n is equal to 3 with a BCH code of the TEC-QED type. The aim is to detect errors that affect up to 5 bits in a code word.

Equation (4) is then available as a variant (6) in order to determine the presence of such an error and generate an '$alarm_{TEC\text{-}QED}$' alarm signal.

The means for determining, in each version of the decoded code word, whether a number of errors is greater than 'n−1=2' are based on the evaluation of the following equation (6):

$$\text{alarm}_{TEC-QED} = \left(\sum v \wedge \vee D'_3\right) \vee \vee D_4 \tag{6}$$

where, in addition to the notations shared with equation (5):

- $D'_3$ is the determinant of the following matrix with the elements $s_i$ defined by equation (2):

$$D'_3 = \begin{vmatrix} s_3 & 1 \\ s_5 & s_2 \end{vmatrix}$$

- $D_4$ is a determinant defined as indicated above for a TEC-QED type BCH type ECC.

A third example is applicable in the case where n is equal to 4 with a QEC-QED type BCH code. The aim is to detect errors that affect up to 6 bits in a code word.

Equation (4) is then available as a variant (7) in order to determine the presence of such an error and generate an '$alarm_{QEC\text{-}QED}$' alarm signal.

The means for determining, in each version of the decoded code word, whether a number of errors is greater than 'n−1=3' are based on the evaluation of the following equation (7):

$$\text{alarm}_{QEC-QED} = \left[\overline{\sum v} \wedge (\vee D_4 \vee \vee D'_4)\right] \vee \vee D_5 \tag{7}$$

where $D_4$ and $D_5$ are determinants defined as indicated above for a QEC-QED type BCH type ECC, and where $D'_4$ is the determinant of the following matrix with the components $s_i$ defined by equation (2):

$$D'_4 = \begin{vmatrix} s_1 & 1 & 0 \\ s_3 & s_2 & s_1 \\ s_7 & s_6 & s_5 \end{vmatrix}.$$

Three examples of the computation of a warning signal for values of n=2, n=3 and n=4 have been illustrated. A person skilled in the art will consider that other cases can be derived from these three examples by applying the same principles of an adaptation of equation (4) to the case that is considered for evaluating the value of the alarm signal.

FIG. 4 illustrates an architecture of an ECC decoder that can be used in a memory controller for implementing the method of the invention, for an embodiment for detecting conventionally uncorrectable errors.

During a read operation for an initial memory word, the ECC decoder 400 receives a code word potentially affected by programming, storage or read errors. Based on this word, a syndrome is generated by a syndrome generator (module 410) that implements multiplication operations in order to produce the matrix product H·v (Equation (1)).

Depending on the syndrome that is obtained, it is possible to determine whether any read bit is erroneous, as long as the total number of erroneous bits does not exceed a maximum number n of bits that can be corrected by the ECC.

Based on the syndrome, an error vector generator (module 420) generates a check bit for each read bit. The set of check bits is called an error vector where the check bits with a value equal to 1 indicate the positions of the erroneous bits in the read word.

Each read bit can be corrected using an exclusive- or (xor) logic gate with two inputs, one input for the bit to be corrected in the initially read word and another input controlled by the check bit corresponding thereto in the error vector. A correction module 430 contains all the xor gates.

The conventionally corrected code word is delivered by the module 430.

The vast majority of ECCs used to protect memories are able to provide information that is not only linked to correctable errors and to allow syndromes to be detected that are not associated with conventionally correctable errors.

Advantageously, the device of the invention uses such information concerning the number of errors in order to detect errors that are not conventionally correctable.

This information can correspond:

- to a subset of (n+1)-errors, for an ECC with a minimum Hamming distance that is equal to 2n+1;
- all the (n+1)-errors and optionally a subset of (n+2)-errors, for an ECC with a minimum Hamming distance that is equal to 2n+2.

This information is detected and used by modifying a conventional decoder. The example of the ECC decoder of FIG. 4 proposes implementing circuits comprising an or-logic gate 440 (commonly called "or" gate), a not-or-logic gate 450 (commonly called 'nor' gate) and an and-logic gate 460 (commonly called "and" gate).

The or gate 440 receives the syndrome bits originating from the syndrome generator 410 as input.

The nor gate 450 receives the bits of the error vector originating from the error vector generator 420 as input.

The outputs of the or gate 440 and of the nor gate 450 become the inputs of the and gate 460, which delivers a signal representing an uncorrectable error.

This configuration is used (1) to check, via the result of the or gate, whether at least one syndrome bit differs from 0 (a syndrome where all the bits are equal to 0 indicates the absence of an error), and (2) to check, via the result of the nor gate, whether all the bits of the error vector are equal to 0. Combining the outputs by the and gate provides information concerning the presence or absence of an uncorrectable error.

In the case of ECCs with a minimum Hamming distance that is equal to 2n+2, the detection mechanism can be simplified by taking advantage of the fact that the code words are all even or odd. A person skilled in the art can derive implementation variants depending on the error-correcting code that is used.

For BCH type codes (Bose, Ray-Chaudhuri and Hocquenghem), other detection methods are described in the aforementioned article by J. Freudenberger, M. Rajab and S. Shavgulidze.

FIG. 5 illustrates another embodiment of the architecture of an ECC decoder that can be used in a memory controller for implementing the method of the invention.

The decoder 500 comprises circuits (510, 520, 530, 540, 550, 560) that are respectively functionally similar to the circuits (410, 420, 430, 440, 450, 460) of the decoder 400 of FIG. 4, which are not described again.

In this alternative embodiment, the decoder 500 further comprises a syndrome comparator circuit 570 that allows an 'n-error' signal to be generated that indicates the presence or absence of an n-error.

The circuit 570 is configured to compare the syndrome generated during the ECC decoding operation with all the syndromes that can be generated by an n-error in order to identify whether the memory word that has just been read is affected by such an error. A less costly implementation involves checking whether the syndrome generated during a decoding operation is non-zero, which indicates the presence of erroneous bits, and is different from all the syndromes generated by errors that affect fewer than n bits.

This signal can be used during the first decoding 320 and second decoding 350 steps to check whether the memory word that has just been read and decoded (without or with inversion of weak-bits) contains a number of erroneous bits that exceeds a certain threshold.

FIG. 6 illustrates an embodiment of a circuit for selecting a corrected word, according to the step 360.

The selection circuit 600 is a device coupled to each output bit of an ECC decoder, and is configured to enable a choice to be made between a corrected bit without or with inversion of the weak-bits, i.e., depending on the result of steps 320 or 350.

During operation after the first decoding step 320, each bit of a decoded word (i.e., the signal $out_{dec1}$) and the bit of the uncorrectable $error_{dec1}$ signal that exit the ECC decoder (for example, that of FIG. 4), are respectively stored in a flip-flop 610, 620.

An 'en' signal is used to synchronize the capture of the signals at the inputs of the flip-flops 610 and 620 with the end of the first decoding operation of step 320.

During operation after the second decoding step 350, the n-error signal and the uncorrectable $error_{dec2}$ signal are combined by the same nor type logic gate 630.

Unlike the first decoding process, the uncorrectable $error_{dec2}$ signal delivered after the second decoding process is not stored (i.e., in the flip-flop 620), and the $out_{dec2}$ signal is not stored (i.e., in the flip-flop 610).

The output of the nor gate 630 is combined in an or logic gate 640 with the bit of the uncorrectable $error_{dec1}$ signal that was stored in the flip-flop 620 after the first decoding process, in order to deliver a selection signal $sel_{out}$.

The selection signal $sel_{out}$ controls a multiplexer 650 to deliver an output signal out corresponding to the selected bit (i.e., the corrected bit after the first decoding process or after the second decoding process with inversion of weak-bits).

The multiplexer 650 takes the signal $out_{dec2}$ at the output of the decoder after the second decoding process and the signal $out_{dec1}$ that was stored in the flip-flop 610 after the first decoding process as inputs.

During operation, the output of the nor gate 630 is used to provide a signal indicating whether the ECC decoder (which allows correction of a maximum of n erroneous bits per code word) has had to manage an error that affects a maximum of n−1 erroneous bits.

Thus, after the step 350, if neither of the two input bits of the nor gate 630 is equal to 1 (the second decoding process has indicated neither an n-error nor an uncorrectable error), and if there was no uncorrectable error during the first decoding step 320, the signal $sel_{out}$ allows the multiplexer 650 to select the signal $out_{dec2}$, i.e., the word decoded during the step 350, i.e., with inversion of weak-bits.

Furthermore, if the ECC decoder indicates an uncorrectable error during the first decoding step 320, the or gate 640, which takes the output of the nor gate 630 and the output of the flip-flop 620, generates a signal $sel_{out}$ that allows the multiplexer 650 to also select the signal $out_{dec2}$, i.e., the word decoded during the step 350, i.e., with inversion of weak-bits.

The values of the bits output from the ECC decoder on completion of the second decoding step 350 are retained at least until the end of the step 360 of selecting the corrected word.

A flip-flop 610 and a multiplexer 650 must be provided for each corrected bit that exits the ECC decoder in the memory controller 120.

In the case where the step 330 has indicated that the number of erroneous bits is below the threshold (no branch), a distinction between signals with the same name but with different indices (dec1, dec2) no longer makes sense. In this case, the two signals $n\text{-}error_{dec2}$ and uncorrectable $error_{dec2}$ at the input of the gate 630 are 0, and the signal $sel_{out}$ is 1, then allowing selection of the initial corrected word without inversion of weak-bits, i.e., the signal $out_{dec2}$ as shown in FIG. 6.

In the case where the ECC decoder indicates an uncorrectable error on completion of each of the two decoding steps 320 and 350, the memory controller notifies the host that made the read memory request of an uncorrectable error.

In one embodiment, the flip-flops 610 and 620 are latch-type circuits.

FIG. 7 illustrates the steps of the method for reading with error-correction of the invention according to another embodiment. The method 700 begins with a step 710 of measuring resistances and identifying weak-bits.

The step 710 corresponds to resistance measurements, on the one hand, by comparing with a reference value, such as the measurements described for step 310, and, on the other hand, by comparing with a modified reference value (i.e., slightly higher and slightly lower), such as the measurements described for step 340.

The step 710 is used to identify weak-bits.

An implementation of a circuit of step 710 can involve three triple sense amplifiers per read bit.

Following the step 710, all the weak-bits of the read word at the memory address indicated by the host are identified.

The method continues with two operations for decoding the word that are carried out at the same time.

A first ECC decoding process (step 720) is carried out without inversion of weak-bits, and a second ECC decoding process (step 730) is carried out simultaneously with all the inverted weak-bits as identified during the resistance measurements with the modified reference value.

In this embodiment, the memory controller 120 contains two ECC decoders.

After the ECC decoding steps (720, 730), the method allows, in a subsequent step 740, the version of the corrected code word with the fewest erroneous bits to be determined and selected, between the version of the word decoded by the first decoding process without inversion of weak-bits, and the version of the word decoded by the second decoding process with inversion of weak-bits.

The method ends with a step 750 involving delivering the selected corrected word.

An implementation of a circuit of the method 700 is illustrated in FIG. 8. It is based on a device similar to that of FIG. 6, where the or logic gate 840 and the multiplexer 850 are equivalent to the or logic gate 640 and the multiplexer 650 of the implementation shown in FIG. 6.

The circuit of FIG. 8 further comprises a logic gate 820 for inverting the input signal n-error$_{dec1}$, which is an error information signal indicating the presence of more than n−1 errors in the decoded code word without inversion of weak-bits (step 720).

The circuit also comprises a nor gate 830 that functions like the nor gate 630 of FIG. 6, but has an additional input produced by the output of the gate 820.

The signals used to generate error information in order to determine the corrected word to be delivered are generated, on the one hand, by an ECC decoder carrying out decoding without inversion of weak-bits (signals denoted "out$_{dec1}$", "n-error$_{dec1}$" and "uncorrectable error$_{dec1}$"), and are generated, on the other hand, by an ECC decoder carrying out decoding with inversion of weak-bits (signals denoted "out$_{dec2}$", "n-error$_{dec2}$" and "uncorrectable error$_{dec2}$").

As indicated, the method of the invention allows the gain in error correction capacity to be increased by carrying out weak-bit identification and utilization operations when an uncorrectable error is detected, but also when certain correctable errors are present.

FIG. 9 is a graph showing error correction rates obtained with solutions of the prior art (SOTA, DEC, TEC, QEC) and with the method of the present invention.

The ordinate of the graph indicates the "UBER" ("Uncorrectable Bit Error Rate") metric that characterizes the error rate after decoding according to various types of ECC error-correcting code, applied to a resistive memory configured in 2T2R with 32 data bits per memory word.

The abscissa shows the number of sigmas between the average values of the distributions of the differences of the HRS-LRS and LRS-HRS electrical resistors used in 2T2R to encode logic 1 and 0 values.

The points on the graph indicated by the DEC, TEC and QEC indicators represent the error rates obtained with conventional correction codes of the DEC, TEC and QEC types, respectively.

The points on the graph indicated by the "SOTA" (state-of-the-art) indicator represent the results obtained with the solution described in the aforementioned paper by V. Gherman, L. Ciampolini, S. Evain and S. Ricavy entitled "Error Correction Improvement based on Weak-Bit-Flipping for Resistive Memories", Microelectronics Reliability, volume 136, 2022.

The points on the graph indicated by the "DEC-TED+ weak-bit-flipping" indicator represent the error rates obtained with the method of the invention.

It can be seen that the proposed solution allows the error rate to be reduced by more than an order of magnitude (under certain conditions).

Some common examples of error-correcting codes are as follows:

- a DEC, which has a capacity for correcting a maximum of two erroneous bits per code word;
- a DEC-TED, which allows correction of a maximum of two erroneous bits and the detection of three erroneous bits per code word;
- a TEC, which has a capacity for correcting a maximum of three erroneous bits per code word;
- a TEC-QED, which allows correction of a maximum of three erroneous bits and the detection of four erroneous bits per code word;
- a QEC, which allows correction of a maximum of four erroneous bits per code word;
- a QEC-QED, which allows correction of a maximum of four erroneous bits and the detection of five erroneous bits per code word.

It should be noted that a DEC code requires 12 check bits per code word with 32 data bits, and that a DEC-TED code requires 13 check bits for the same number of data bits per code word. The TEC and QEC codes require 18 and 24 check bits per code word with 32 data bits, respectively.

The present description illustrates a preferred implementation of the invention, which is by no means limiting, however. Examples are selected to provide a good understanding of the principles of the invention and a practical application, but they are by no means exhaustive and should allow a person skilled in the art to make modifications and implementation variants to the various circuits while retaining the same principles. In alternative embodiments, each functional encoding, counting, comparison and inversion module can be implemented by a dedicated module such as an ASIC.

The invention can be implemented using hardware and/or software components. It can be available as a computer program product executed by a dedicated processor or by a memory controller of a storage system, and which comprises code instructions for executing the steps of the processes according to their various embodiments.

The invention claimed is:

1. A device for reading a code word stored in a resistive memory where each memory cell comprises resistive devices for storing a bit of a code word, the reading device comprising:

- means for measuring the resistance of each resistive device storing a bit of a code word to be read, and for identifying weak-bits;
- means for carrying out, with an error-correcting code decoder having a maximum correction capacity of n erroneous bits, a first and a second process of decoding the code word, with the first and second decoding processes being carried out without and with inversion of the weak-bits, respectively;
- means for determining, in each version of the decoded code word, information concerning the number of errors, with respect to errors that are detectable but uncorrectable according to the correction capacity of said error-correcting code and with respect to errors that are correctable according to the correction capacity of said error-correcting code and that affect a maximum number of erroneous bits; and
- means for selecting the version of the decoded code word without inversion of weak-bits if the information concerning the number of errors for the version of the decoded code word without inversion of weak-bits does not provide a number of errors that is greater than n−1; or the version of the decoded code word with inversion of weak-bits if the information concerning the number of errors for the version of the decoded code word without inversion of weak-bits indicates a number of uncorrectable errors or if the information concerning the number of errors for the version of the decoded code word with inversion of weak-bits does not provide a number of errors that is greater than n−1 and the information does not indicate an uncorrectable error.

2. The device according to claim 1, wherein the means for measuring the resistance of each resistive device comprise means for measuring the resistance of each resistive device relative to a reference resistance value.

3. The device according to claim 1, wherein the means for measuring the resistance of each resistive device comprise means for measuring the resistance of each resistive device relative to two resistance values.

4. The device according to claim 1, wherein the means for identifying weak-bits comprise means for comparing the measured resistance of each resistive device with a resistance value that is slightly greater than the reference resistance value, and with a resistance value that is slightly less than the reference resistance value, and for identifying those bits with results from these resistance comparisons that are not identical.

5. The device according to claim 1, wherein the means for carrying out a first and a second process of decoding the code word comprise means for sequentially carrying out the first and the second decoding process.

6. The device according to claim 1, wherein the means for carrying out a first and a second process of decoding the code word comprise means for simultaneously carrying out the first and the second decoding process.

7. The device according to claim 1, wherein the error-correcting code is of the SEC, SEC-DED, DEC, DEC-TED, TEC, TEC-QED, QEC, QEC-QED type.

8. The device according to claim 1, wherein the error-correcting code has a minimum Hamming distance du between the code words that is equal to 2n+2.

9. The device according to claim 8, wherein the error-correcting code is of the DEC-TED type with a minimum Hamming distance $d_H$ between the code words that is equal to 2n+2=6, and wherein the means for determining, in each version of the decoded code word, whether a number of errors is greater than 'n−1=1' rely on the evaluation of the following equation:

$$\text{alarm}_{DEC-TED} = \left(\overline{\sum v} \wedge \vee D_2\right) \vee \vee D_3.$$

10. The device according to claim 8, wherein the corrector code is of the TEC-QED type with a minimum Hamming distance $d_H$ between the code words that is equal to 2n+2=8, and wherein the means for determining, in each version of the decoded code word, whether a number of errors is greater than 'n−1=2' rely on the evaluation of the following equation:

$$\text{alarm}_{TEC-QED} = \left(\sum v \wedge \vee D'_3\right) \vee \vee D_4.$$

11. The device according to claim 8, wherein the corrector code is of the QEC-QED type with a minimum Hamming distance $d_H$ between the code words that is equal to 2n+2=10, and wherein the means for determining, in each version of the decoded code word, whether a number of errors is greater than 'n−1=3' rely on evaluation of the following equation:

$$\text{alarm}_{QEC-QED} = \left[\overline{\sum v} \wedge (\vee D_4 \vee \vee D'_4)\right] \vee \vee D_5.$$

12. An electronic system of the FPGA or ASIC type comprising a device according to claim 1.

13. A method for reading a code word stored in a resistive memory where each memory cell comprises resistive devices for storing a bit of a code word, the method comprising at least the following steps of:

- measuring the resistance of each resistive device storing a bit of a code word to be read, and identifying weak-bits;
- carrying out, using an error-correcting code decoder with a maximum correction capacity of n erroneous bits, a first and a second process of decoding the code word, with the first and the second decoding processes being carried out without and with inversion of the weak-bits, respectively;
- determining, in each version of the decoded code word, information concerning the number of errors, with respect to errors that are detectable but uncorrectable according to the correction capacity of said error-correcting code and with respect to errors that are correctable according to the correction capacity of said error-correcting code and that affect a maximum number of erroneous bits; and
- selecting the version of the decoded code word without inversion of weak-bits if the information concerning the number of errors for the version of the decoded code word without inversion of weak-bits does not provide a number of errors that is greater than n−1; or the version of the decoded code word with inversion of weak-bits if the information concerning the number of errors for the version of the decoded code word without inversion of weak-bits indicates a number of uncorrectable errors or if the information concerning the number of errors for the version of the decoded code word with inversion of weak-bits does not provide a number of errors that is greater than n−1 and the information does not indicate an uncorrectable error.

14. The method according to claim 13, wherein the decoding step involves sequentially carrying out a first decoding process without inversion of weak-bits and a second decoding process with inversion of weak-bits.

15. The method according to claim 13, wherein the decoding step involves simultaneously carrying out a first decoding process without inversion of weak-bits and a second decoding process with inversion of weak-bits.

* * * * *